(12) United States Patent
Mohammad et al.

(10) Patent No.: US 9,679,632 B2
(45) Date of Patent: Jun. 13, 2017

(54) VOLATILE MEMORY ERASURE BY THE RANDOMIZATION OF DATA STORED IN MEMORY CELLS

(71) Applicant: Khalifa University of Science, Technology & Research (KUSTAR), Abu Dhabi (AE)

(72) Inventors: Baker Shehadah Mohammad, Abu Dhabi (AE); Khaled Hamed Salah, Abu Dhabi (AE); Mahmoud Abdullah Al-Qutayri, Abu Dhabi (AE)

(73) Assignee: Khalifa University of Science and Technology, Abu Dhabi (AE)

( * ) Notice: Subject to any disclaimer, the term of this patent is extended or adjusted under 35 U.S.C. 154(b) by 0 days.

(21) Appl. No.: 14/681,156

(22) Filed: Apr. 8, 2015

(65) Prior Publication Data

US 2016/0300600 A1    Oct. 13, 2016

(51) Int. Cl.
*G06F 12/00* (2006.01)
*G11C 11/4072* (2006.01)
*G11C 7/20* (2006.01)

(52) U.S. Cl.
CPC ............ *G11C 11/4072* (2013.01); *G11C 7/20* (2013.01)

(58) Field of Classification Search
None
See application file for complete search history.

(56) References Cited

U.S. PATENT DOCUMENTS

| 7,010,644 B2 * | 3/2006 | Gilton ............ G11C 5/005 711/106 |
| 2007/0214508 A1 * | 9/2007 | Fukui ............ H04N 1/00501 726/28 |

* cited by examiner

*Primary Examiner* — Kevin Verbrugge
(74) *Attorney, Agent, or Firm* — Hayes Soloway PC

(57) ABSTRACT

The present invention discloses an erasure circuitry, a method for erasing a volatile memory, a volatile memory and a processing unit coupled with an operating system, where the erasure circuitry is adapted to erase the volatile memory at occurrence of a predefined event. The erasure circuitry includes a control unit for initiating a dummy operation to randomize data of one or more memory cells at the occurrence of a predefined event. The control unit is adapted to receive the addresses of the memory blocks from a processing unit via an operating system.

30 Claims, 15 Drawing Sheets

VOLATILE MEMORY ERASURE BY THE RANDOMIZATION OF DATA STORED IN MEMORY CELLS

FIELD OF THE INVENTION

The present invention relates generally to volatile memory erasure and more particularly to a method, an erasure circuitry, and a volatile memory adapted for erasing the data stored inside one or more memory banks of the memory.

BACKGROUND OF THE INVENTION

In the cloud virtualized infrastructure, multiple tenants may co-exist in the same physical host, sharing the host's physical DRAM memory and disk storage. Virtualization technology used in the cloud creates the illusion of having multiple virtual machines (VMs) within the same physical host by means of sharing and multiplexing the host resources which include its multiple CPU cores, physical memory, and hard disk. FIG. 1 shows three VMs which belong to different users that are allocated portions of physical memory and hard disk.

In the cloud, the VMs are allocated on demand and dynamically to different users. A VM may stay running for some period of time (minutes, hours, or days) and then get terminated by a user. Once terminated, its resources are re-allocated to a newly provisioned VM. Each time a new VM is allocated, its resources are allocated from the older VM resources, as shown in FIG. 2.

FIG. 2 illustrates resource allocation after termination of VM2 and provisioning of VM4. FIG. 2(a) shows that the memory and disk resources of VM2 are available for use after VM2 termination. In FIG. 2(b), a new virtual machine is provisioned by user 4 (VM4) and has been allocated the memory and disk resources of VM2. Once VM4 is running, the user of this VM can have access to the content of DRAM and disk storage which was used by the older user. The new user can simply take memory images and snapshots and then perform offline forensic analysis to extract sensitive information of the older user. This indeed poses a serious data privacy problem.

As has been illustrated, a critical security problem and data privacy issue can exist if the DRAM content is not sanitized or wiped out before being allocated to a newly provisioned VM. The cloud provider has to provide a total isolation and protection of user data during run time and after termination. If the data in physical memory and hard disk are not properly sanitized and deleted at run time and after deletion, sensitive information can be leaked, thereby jeopardizing the privacy of the cloud users and their data. Sensitive information may include confidential documents and images, passwords, encryption keys, personal information and records, banking and credit card information, metadata, etc.

The cloud computing platform is just one example of contexts where physical memory is shared between multiple users. A single physical machine can also provide access to multiple users in a sequential manner such that different sessions are initiated and terminated for different users. If data stored on the physical memory by one user is not deleted, this data can be accessed by a subsequent user accessing the machine.

To date, wiping out the DRAM and disk storage, if done, is performed using software by means of zeroing out DRAM content using software. At boot time of the newly provisioned VM, the software would write zeroes or random data to the DRAM. The zeroing out method involves the CPU to carry out sequential memory-write operations of zeros to all physical memory locations. This is considerably slow and expensive operation especially. For a small size, it may take a few seconds to wipe out 1 GB DRAM. For larger-size VMs, the DRAM portion can be as big as 64 GB or more. For this, wiping out the memory using software may take a few minutes. Such time is not acceptable in some contexts such as by the cloud user as it prolongs the launch and boot time of VM instances.

Other methods can zero out the memory using software at user session/VM termination (and not at boot time). Still, this solution is not adequate and will slow down enormously the availability of the freed memory to be allocated to newly provisioned users/VMs.

In short, software solutions that deal with zeroing out the physical memory at boot up or after termination are not adequate solutions, due to the computation overhead cost. That is, such software solutions will be considerably slow considering the size of the allocated RAM which can be in tens of gigabytes. Such solutions may take minutes, and will stretch the bootup time enormously. Equally, it is also imperative to shorten the termination time of a machine (such as a VM) so that freed resources can be allocated quickly to newly provisioned VMs.

Further, it will be understood to the persons skilled in the art that DRAM provides maximum memory density at cost of access time. Basic DRAM cell 3 consists of one nMOS transistor and one capacitor (FIG. 3). The transistor is used to control access to the storage element (capacitor). The memory state is stored as charge on the capacitor. Since the charge on the capacitor can leak away hence, the need for refreshing when DRAM is used. The refreshing time is determined by the time the capacitor can maintain enough charge to indicate logic one. In addition to refreshing DRAM, read access is destructive which means when the cell gets access for read the data stored is disturbed and another operation need to be performed to re-store data.

Memory controller keeps track of memory array access and refreshing times. It is proposed to utilize this hardware feature that already exists to zeroing DRAM content. This provides hardware managed solution which is much faster than the software counterpart. The implementation of the proposed scheme can vary based on the tradeoff between memory availability, area overhead, and design complexity.

The array size can be static for all programs and will depend on the total memory size or it can be dynamic based on number of programs and overall system performance. FIG. 4 depicts a typical memory array organization with a major interface where N+M are address bits and D is the data interface.

SUMMARY OF THE INVENTION

The present invention aims to overcome the above mentioned limitations and other problems associated with the prior art.

The present invention provides an erasure circuitry, a method for erasing a volatile memory, a volatile memory and a processing unit coupled with an operating system, where the erasure circuitry is adapted to erase the memory at occurrence of a predefined event. The erasure circuitry includes a control unit which is adapted to initiate a dummy operation to randomize data of one or more memory cells at the occurrence of a predefined event.

In an embodiment of the present invention, the erasure circuitry further includes a controller associated with the control unit and a processing unit which is associated with the controller such that the control unit is adapted to receive the addresses of one or more memory cells from the processing unit via the operating system.

In an embodiment of the present invention, the volatile memory is connected to the processing unit which is accessible by multiple users, processes, applications or services such that the predefined event is before switching between first user, process, application or service and a subsequent user, process, application or service such that any data stored inside the memory by the first user is erased by the randomizing of data in the one or more memory cells by the control unit of the erasure circuitry.

In an embodiment of the present invention, the processing unit is part of a virtual machine in a cloud computing platform.

In an embodiment of the present invention, the processing unit is part of an electronic device or a server.

In an embodiment of the present invention, the volatile memory is dynamically allocated to multiple processing units and the predefined event occurs before reallocation of the memory from a first processing unit to a second processing unit such that any data stored inside the memory using the first processing unit gets erased by the randomizing of data in the one or more memory cells by the control unit of the erasure circuitry.

In an embodiment of the present invention, the processing units are part of one or more virtual machines in a cloud computing platform.

In an embodiment of the present invention, the volatile memory for erasure is one or more memory banks of a dynamic random access memory (DRAM).

In an embodiment of the present invention, the controller is a DRAM controller.

In another aspect, the present invention provides a volatile memory which includes a control unit adapted to initiate a dummy operation for randomizing the data stored in the memory cells at occurrence of a predefined event.

In yet another aspect, the present invention provides a method for erasing a volatile memory having a plurality of memory cells. The method involves the initiation of a dummy operation for randomizing the data stored in the memory cells at the occurrence of a predefined event.

BRIEF DESCRIPTION OF THE DRAWINGS

The advantages and features of the present disclosure will become better understood with reference to the following detailed description and claims taken in conjunction with the accompanying drawing, in which:

Like numerals refer to like elements throughout the present disclosure.

DETAILED DESCRIPTION OF THE INVENTION

The exemplary embodiments described herein for illustrative purposes are subject to many variations in structure and design. It should be emphasized, however, that the present invention is not limited to method for erasing data from a volatile memory. It is understood that various omissions and substitutions of equivalents are contemplated as circumstances may suggest or render expedient, but these are intended to cover the application or implementation without departing from the spirit or scope of the present invention.

The terms "a" and "an" herein do not denote a limitation of quantity, but rather denote the presence of at least one of the referenced item.

The terms "having", "comprising", "including", and variations thereof signify the presence of a component.

The present invention provides a software-hardware based technique to erase the data stored on volatile memory. It will be understood for the persons skilled in the art that the volatile memory needs to be refreshed regularly in order to preserve data from leakage. Therefore, the volatile memory may be having a refresh circuitry to ensure that purpose.

Figure 1:
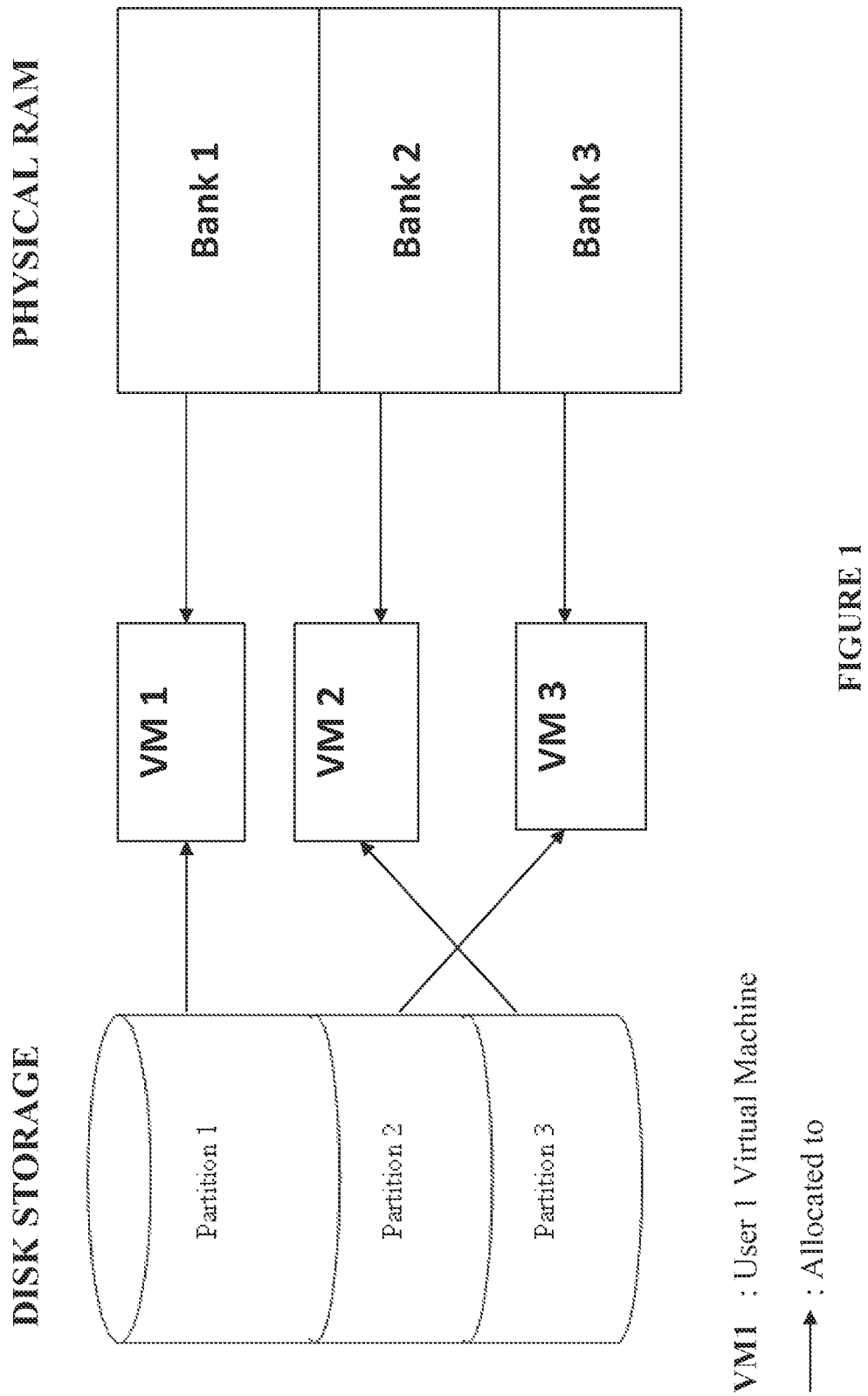
FIG. 1 illustrates a typical virtual machines resource allocation for multiple users in the cloud within a single physical machine.
Figure 2:
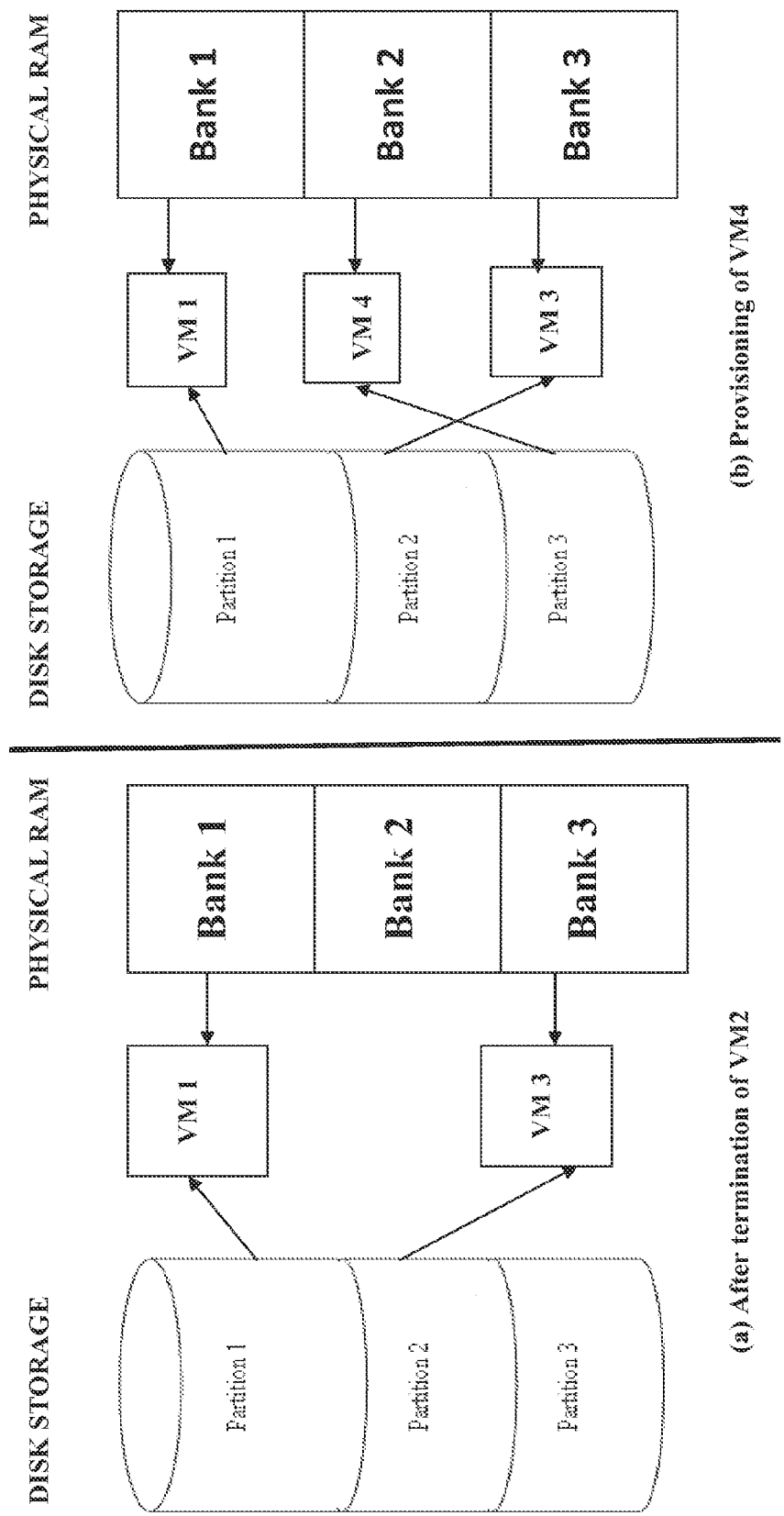
FIG. 2 illustrates resource allocation after termination of VM2 and provisioning of VM4.
Figure 3A:
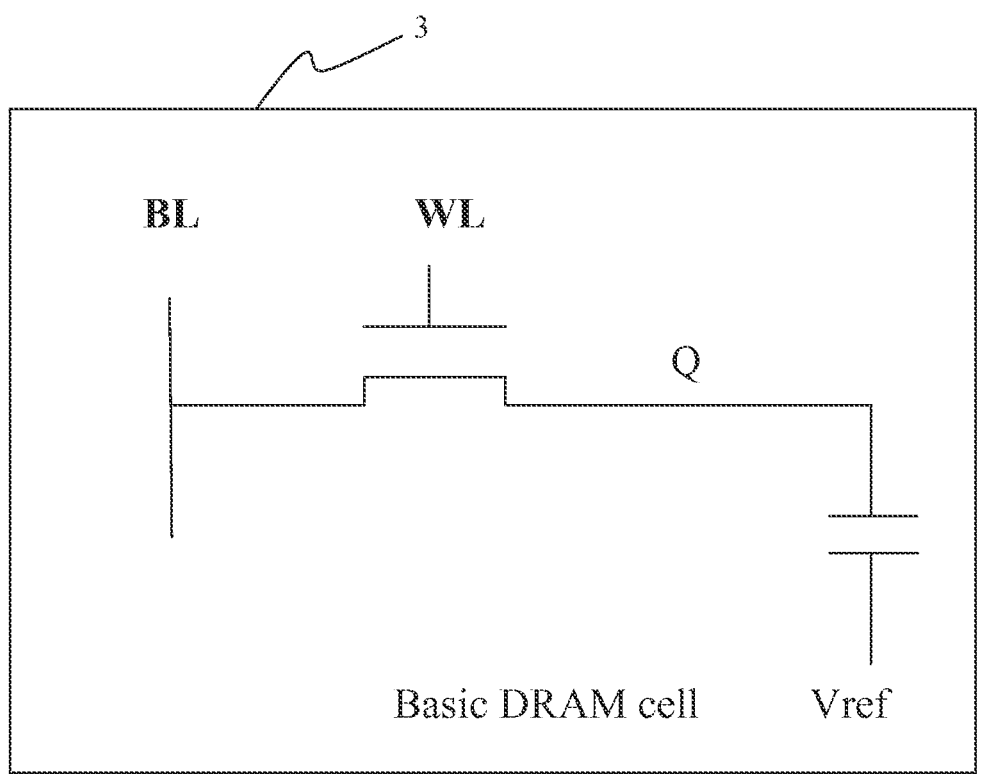
FIG. 3(a) illustrates a DRAM cell structure.
Figure 3B:
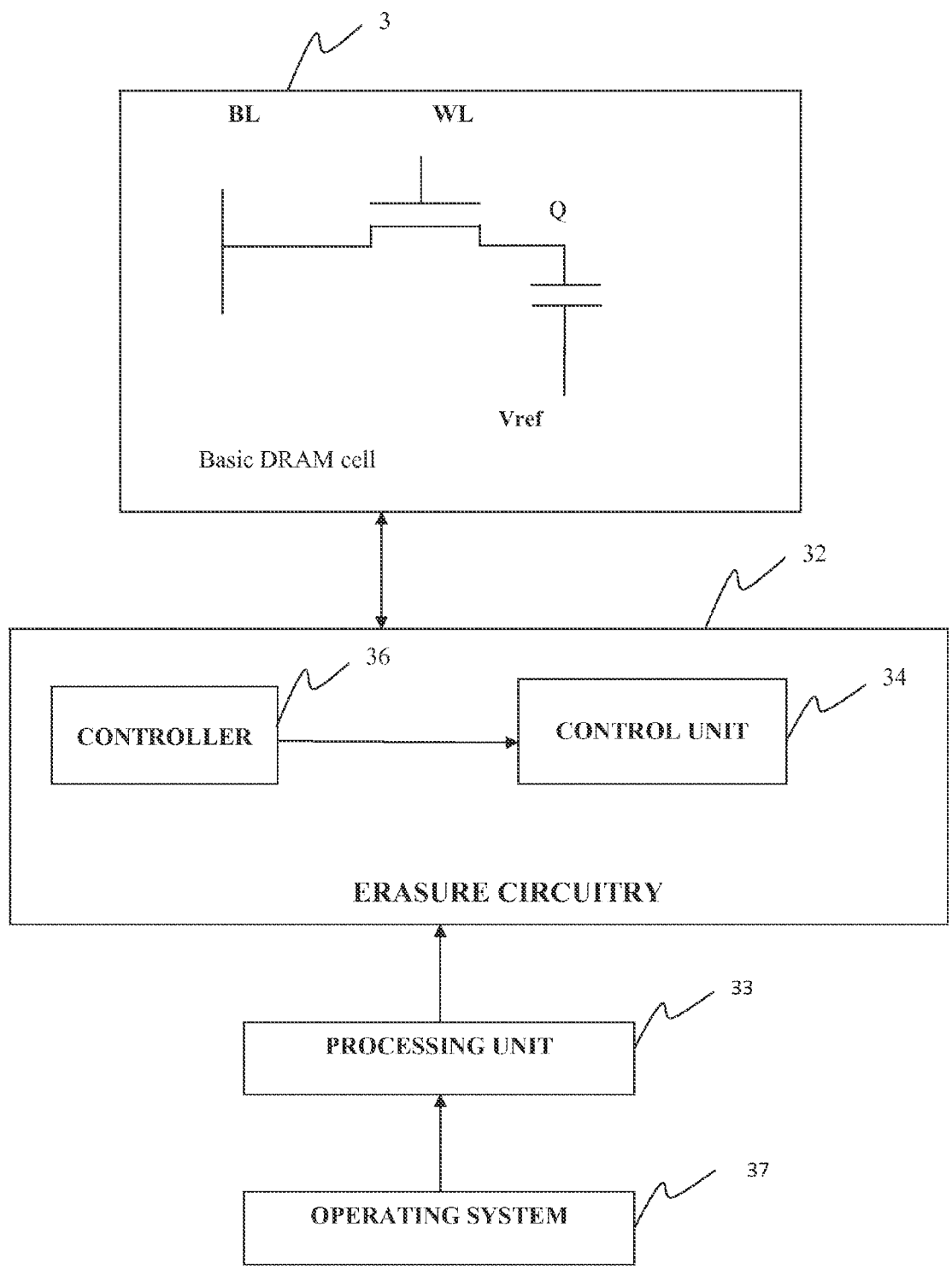
FIG. 3(b) is a block diagram illustrating the functional relation between the volatile memory cell, erasure circuitry, processing unit and the operating system.
Figure 4:
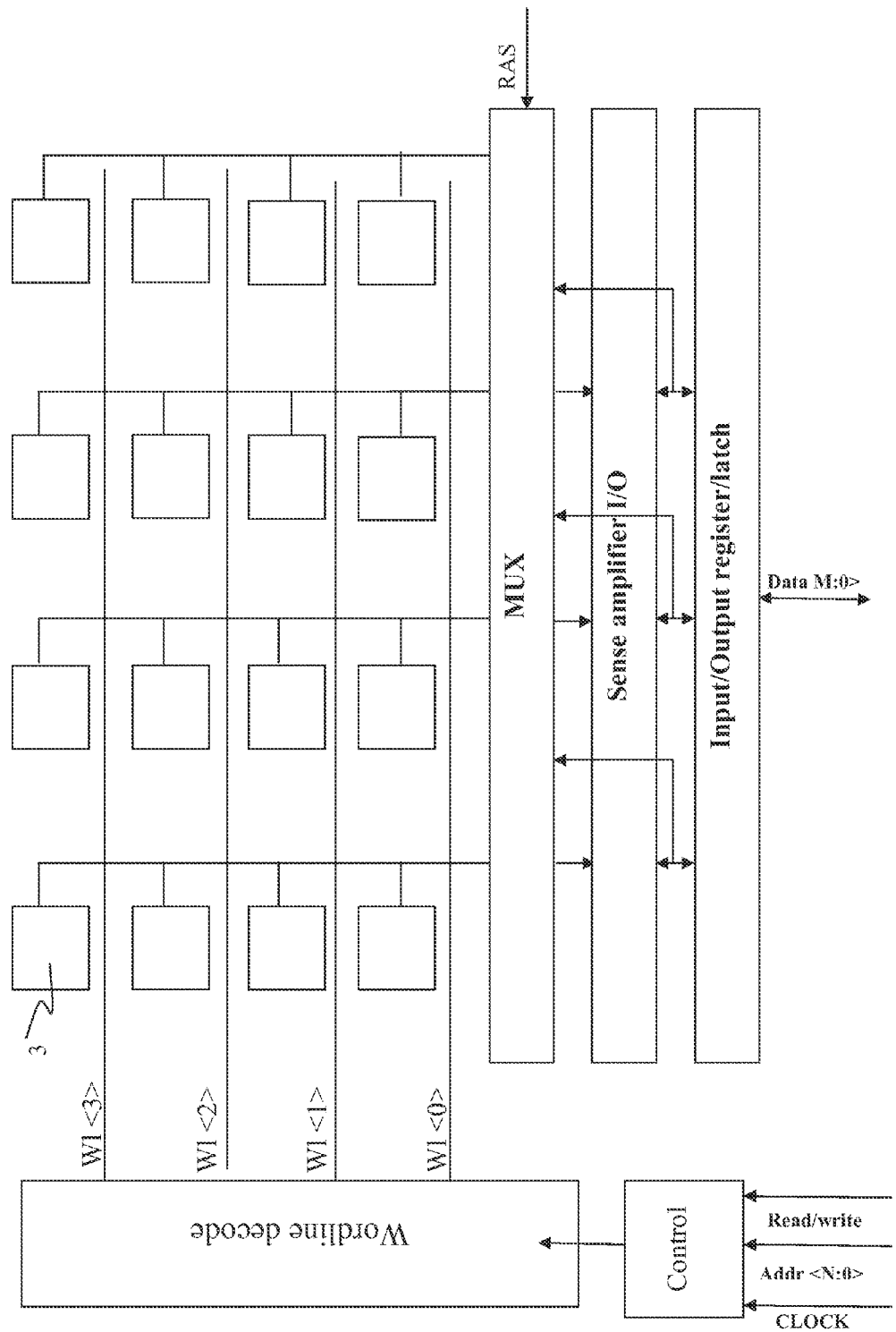
FIG. 4 illustrates a typical memory array organization where major interface N+M are address bits and D is the data interface.

The present invention proposes a method (see FIGS. 5-6), an erasure circuitry 32 adapted to erase the memory by initiating a dummy operation to randomize data in the memory cells (see FIG. 3b). There is also proposed a volatile memory including the erasure circuitry (FIG. 11a and FIG. 11b). A computer encoded medium which includes an erasure module 38 (see FIG. 10) has also been disclosed.

As a first aspect of the invention, as illustrated in FIG. 3b, there is provided an erasure circuitry 32 for erasing volatile memory cells of the volatile memory. The erasure circuitry 32 includes a control unit 34. The control unit 34 is adapted to initiate a dummy operation to the memory cells. The said dummy operation includes the randomization of data in one or more of the memory cells. The randomization of data means corrupting the data stored in the memory cells.

A volatile memory is a set of multiple memory cells. The control unit 34 comprises transistors adapted to be connected the worldliness of the volatile memory for conducting a dummy read on the wordlines at the receipt of a signal to this effect.

In the preferred embodiment, the transistors are nMOS and pMOS transistors. The MOS transistors work in pair, such that each pair of transistors comprises one nMOS transistor and one pMOS transistor connected therebetween and to the volatile memory wordlines in such a manner that one of the transistors imposes a dummy read logic on the wordlines at the receipt of a signal by the other transistor. Preferably, the pMOS transistor imposes a 1 logic on all the wordlines connected thereto when the nMOS transistor turns 1 logic. When both nMOS and pMOS transistors are 0 logic, the wordlines continue operation as usual.

The dummy operation is conducted by using the one or more transistor pairs connected to the wordlines of the volatile memory. As many transistor pairs as desired can be added to the wordlines of a volatile memory, based on the resolution (controllability degree) desired. The more transistor pairs added, higher the resolution is, however the cost increases in consequence.

Adding one transistor pair per wordline allows controlling each wordline independently from the other such that a dummy read on one wordline does not affect another wordline. However, the drawback is that the cost will be increased proportionally with the number of transistor pairs required as a single volatile memory can have thousands of wordlines therefore requiring an equal number of transistor pairs. For the purpose of reducing costs, one transistor pair can be connected to a group of wordlines. In this case, a dummy read will affect collectively all the wordlines in that same group. The resolution (controllability degree) is reduced in this case (with respect to a single transistor pair/wordline), however cost is also reduced. The number of transistor pairs required is a design choice which is to be taken based on the requirements of each application where the resolution requirements is to be counter-balanced with costs.

Figure 13A:
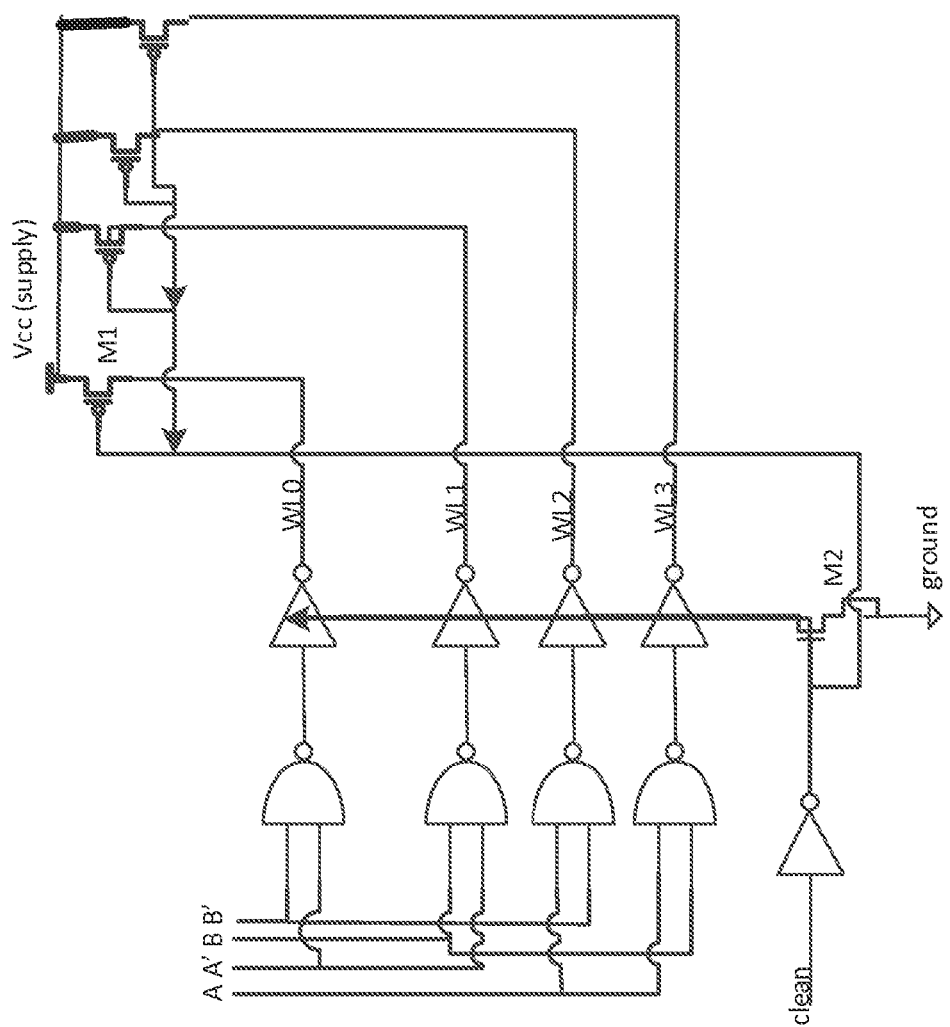
FIG. 13(a) is a block diagram illustrating a memory array with multiple word lines in accordance with an embodiment of the invention.

FIG. 13a illustrates an example where one nMOS transistor is used for a group of wordlines. In this case, one pMOS transistor per wordline is used M2 and one nMOS transistor M1 are added to multiple wordlines of a volatile memory. When the clean signal value is low, both the M1 and M2 are in off state, the wordline functions as normal. When the clean signal is high, then the M1 stops the pull down and the M2 turns on and the value of all the wordlines becomes 1.

Figure 13B:
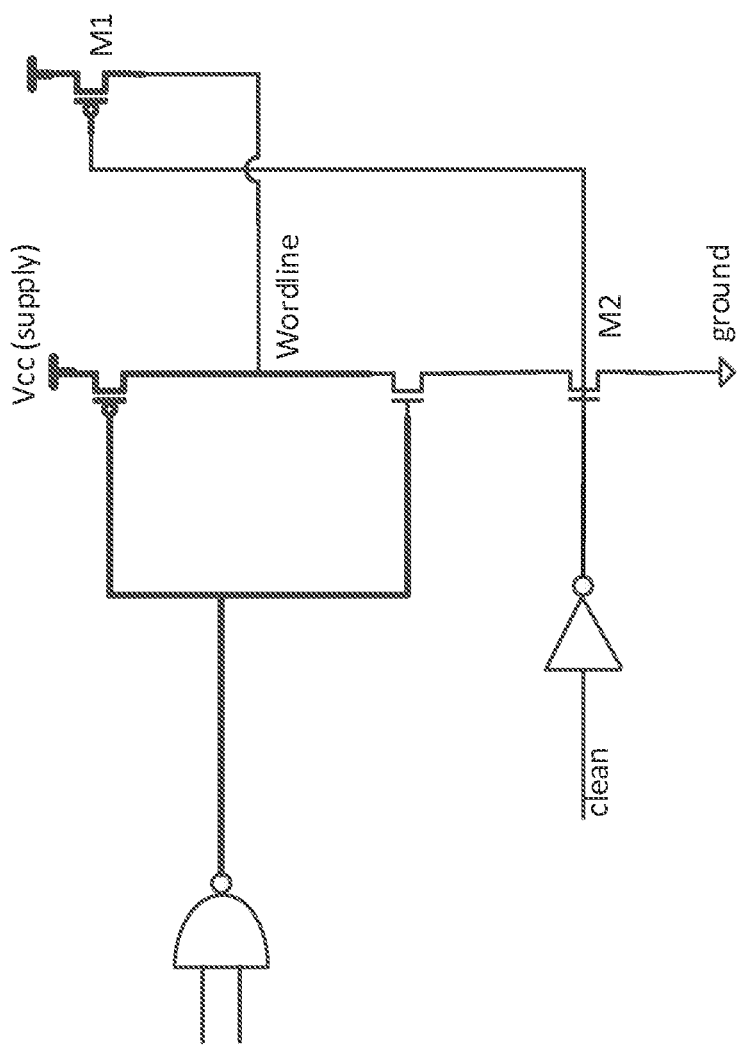
FIG. 13(b) is a block diagram illustrating a memory cell with single word line in accordance with an embodiment of the invention.

FIG. 13b illustrates an example where one transistor pair is used for each wordline. In this case, one pMOS and one nMOS are added to each wordline of a memory cell. When the clean signal value is low, both the M1 and M2 are in off state, the wordline functions as normal. When the clean signal is high, then the M1 stops the pull down and the M2 turns on and the value of the wordlines becomes 1.

In an embodiment of the invention, the control unit 34 is controlled by controller 36 of the erasure circuitry 32. In an embodiment, the controller 36 is embodied in a DRAM controller. In another embodiment, the controller 36 is a DRAM controller.

In an embodiment of the invention, the addresses of the memory blocks from which the data is to be erased are provided by the processing unit 33 via the operating system. The addresses are provided to the control unit 34.

In another embodiment, an erasure module 38 is provided which consists of computer readable instructions to provide instructions to the erasure circuitry 32 regarding the occurrence of a predefined event.

The erasure module 38 includes computer instructions adapted to instruct the erasure circuitry 32 regarding the occurrence of a predefined event (explained later). The controller 36 of the erasure circuitry 32 is adapted to receive such instruction from the erasure module 38 and in due course the addresses of the memory blocks are provided to the control unit 34 for initiating the dummy operation for randomizing data of the memory cells.

Figure 5:
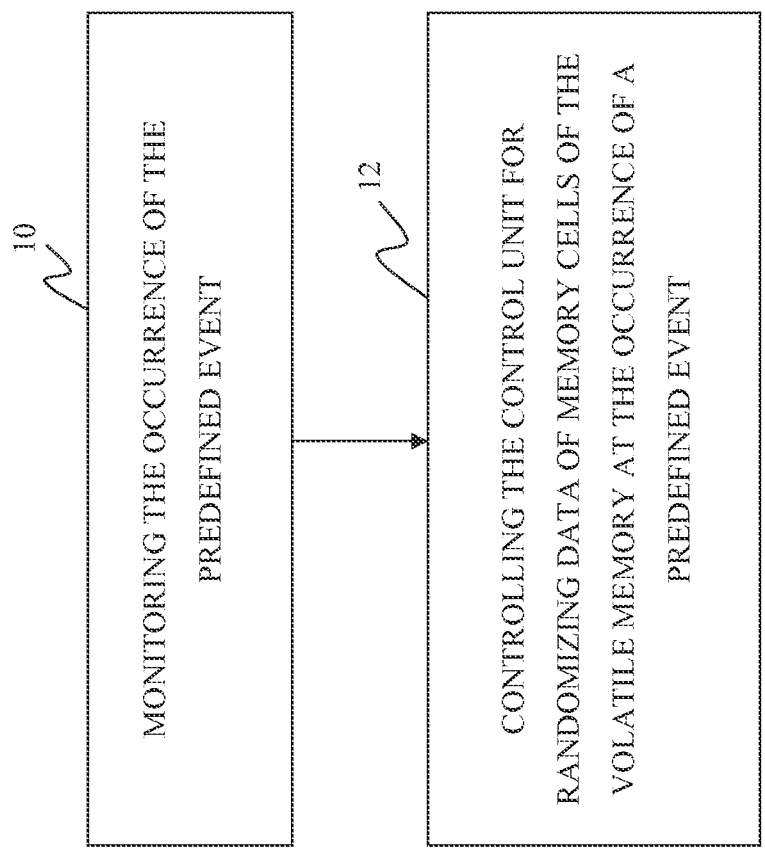
FIG. 5 illustrates a method of erasing a dynamic memory in accordance with an embodiment of the invention.
Figure 6:
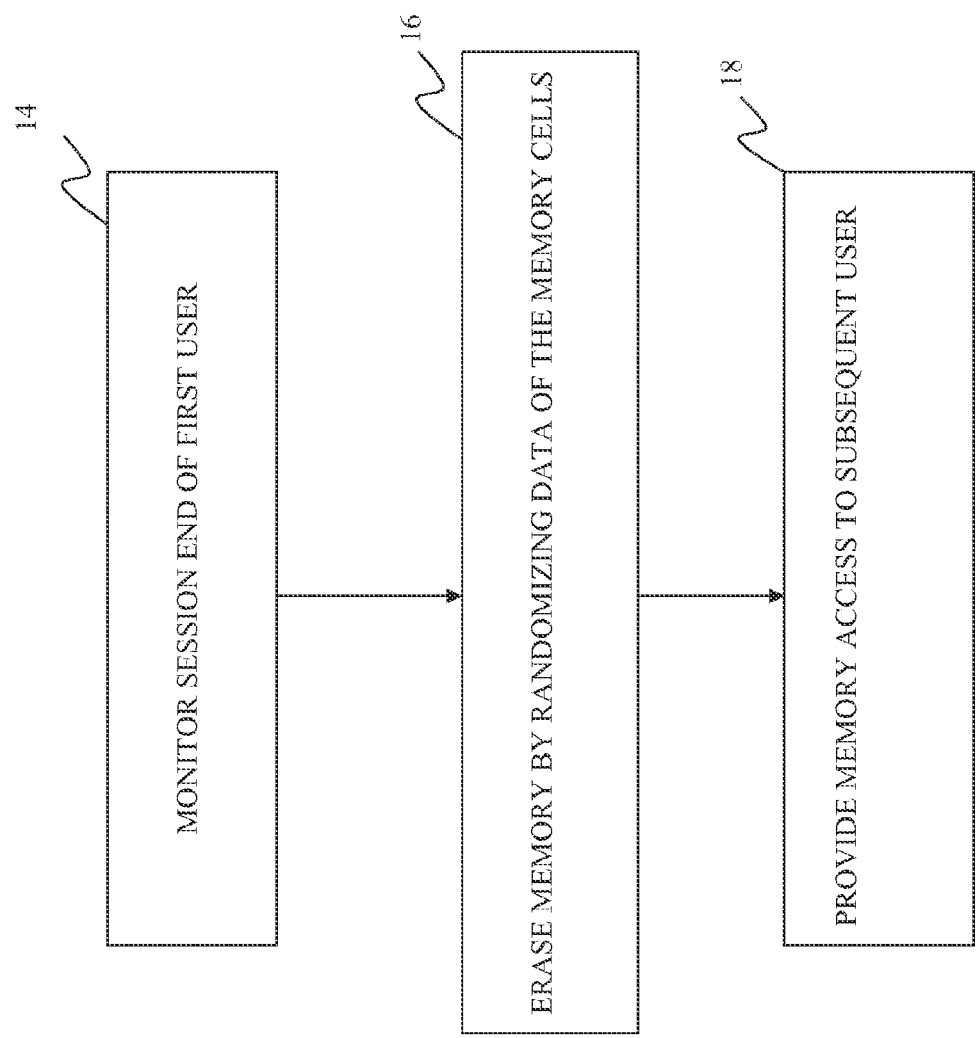
FIG. 6 is a flow chart illustrating an example of application of the method of erasing a dynamic memory in accordance with an embodiment of the invention.

As illustrated in FIG. 5, there is provided a method of erasing a volatile memory requiring, the erasure method comprising controlling the control unit 34 for initiating the dummy operation at the occurrence of a predefined event.

According to this method, the first step is to monitor the occurrence of the predefined event at step 10. Once the predefined event occurs, the second step 12 is to manage the control unit for initiating the dummy operation for randomizing data of one or more of the memory cells at the occurrence of a predefined event.

The predefined event can be any event pre-configured by a user which when it occurs, data stored on the volatile memory 30 needs to be deleted. When the memory 30 is used by users, processes, applications, and/or services, the predefined event can be for example at the time of use or termination and/or switching between the different users, processes, applications and/or services respectively. For example, when the volatile memory 30 is accessed/shared by multiple users, the predefined event can be after termination of a first user session and/or at the time of switching between one user and another (after session termination of a first user and before session commencement of a subsequent user). This is in order to clean/erase the data stored by a first user on the memory before a second user is granted access to the memory.

Sharing volatile memory 30 between multiple users can happen in various contexts, such as for example in computing clouds where virtual machines accessing a same volatile memory 30 are accessed by multiple users. Computing clouds are not the only environments where memory is shared between users. When the volatile memory 30 is accessed by different processes, applications and/or services (related or not to different users), the predefined event can be at the time of termination of a first process, application and/or service respectively and/or at the time of switching between different processes, applications and/or services.

This can also happen for example in the case of a single machine with multiple user accounts. Once a first user uses the machine, data is normally stored on the volatile memory 30 and is not deleted until the machine is rebooted. Where the machine is not rebooted, a subsequent user accessing the machine can have access to the data stored inside the volatile memory 30. This also poses a risk of privacy breach. The predefined event can be in this case at the termination of the first user session. In this case, data stored on the volatile memory 30 is erased before the commencement of the second user session.

Figure 7:
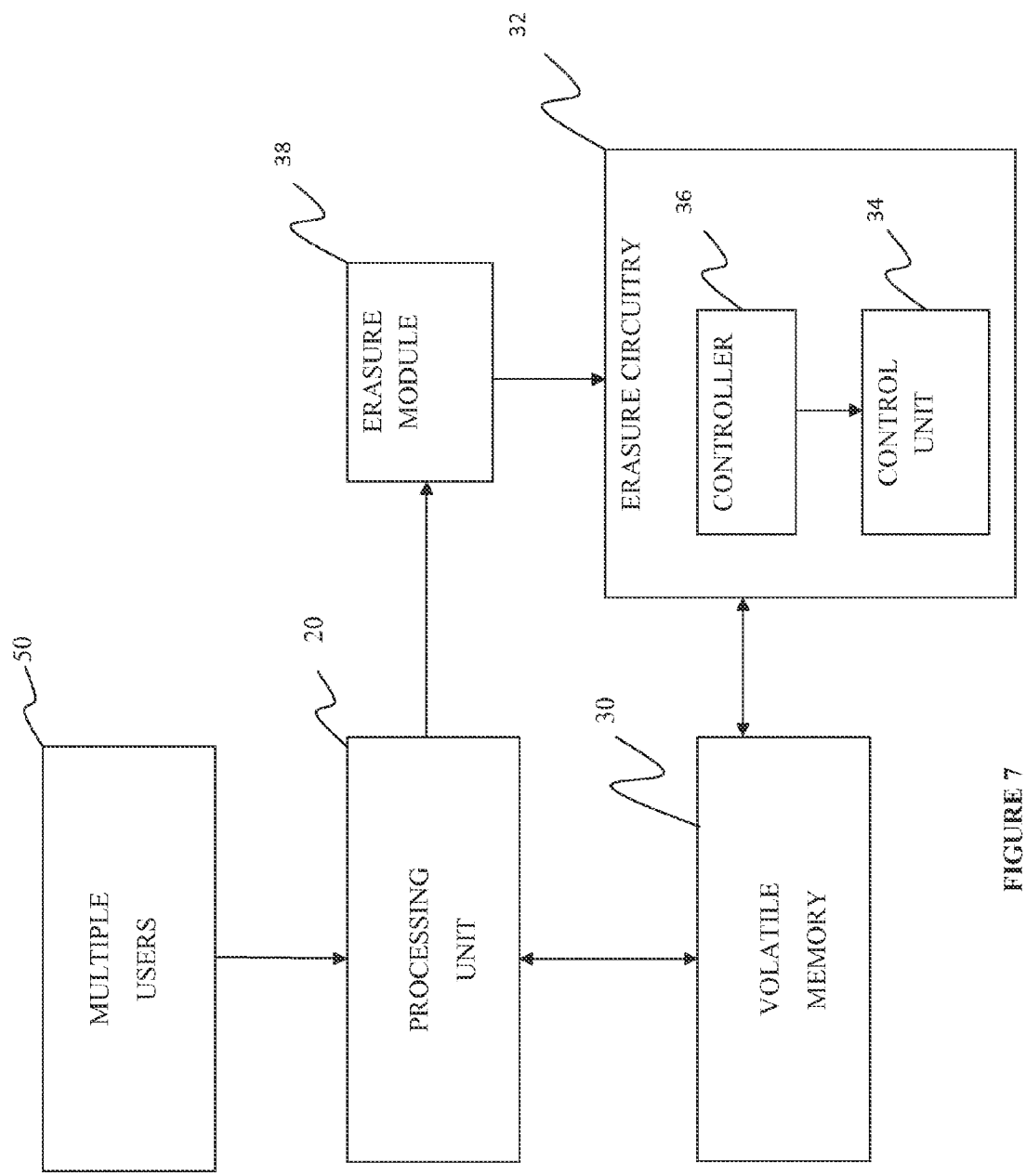
FIG. 7 is a block diagram illustrating multiple user access to a processing unit connected to a volatile memory, erasure module and erasure circuitry in accordance with an embodiment of the invention.

As illustrated in FIG. 7, according to an embodiment of the invention, the first step is to monitor the termination of the first user session at step 14. Once the first user session is terminated, at step 16 the volatile memory is erased by the dummy operation initiated by control unit 34. The dummy operation randomizes the data of the memory cells and hence erasing the data from the previous user. Then, at step 18 the subsequent user is provided access to the memory which is already erased. In this case, there will be no need to reboot the machine to delete the data stored on the memory by the first user or use erasure software which can be time consuming. Erasing the memory using the method of this invention occurs very quickly (in the order of milliseconds).

As illustrated in FIG. 7, the volatile memory 30 can for example be connected to a processing unit 20 accessible by multiple users. In this case, the predefined event is before switching between a first user and a subsequent user such that any data stored inside the memory 30 by the first user is erased by the dummy operation initiated by control unit 34. The dummy operation randomizes the data of the memory cells and hence erasing the data from the previous user.

The predefined event is preconfigured using computer readable instructions inside the erasure module 38 or via the operating system. The erasure module 38 can run on the same processing unit 20 or on a different processing unit depending on the application. The erasure module 38 is connected to the erasure circuitry 32 which in turn is connected to the volatile memory 30. Once the predefined event occurs, the erasure module 38 provides instructions to the controller 36 of the erasure circuitry 32 which in turn manages the control unit for initiating the dummy operation on the memory cells for randomizing data of the memory cells.

In an embodiment of the invention, the processing unit 20 is part of a virtual machine in a computing cloud.

In another embodiment of the invention, the processing unit 20 is part of an electronic device or server.

Figure 8:
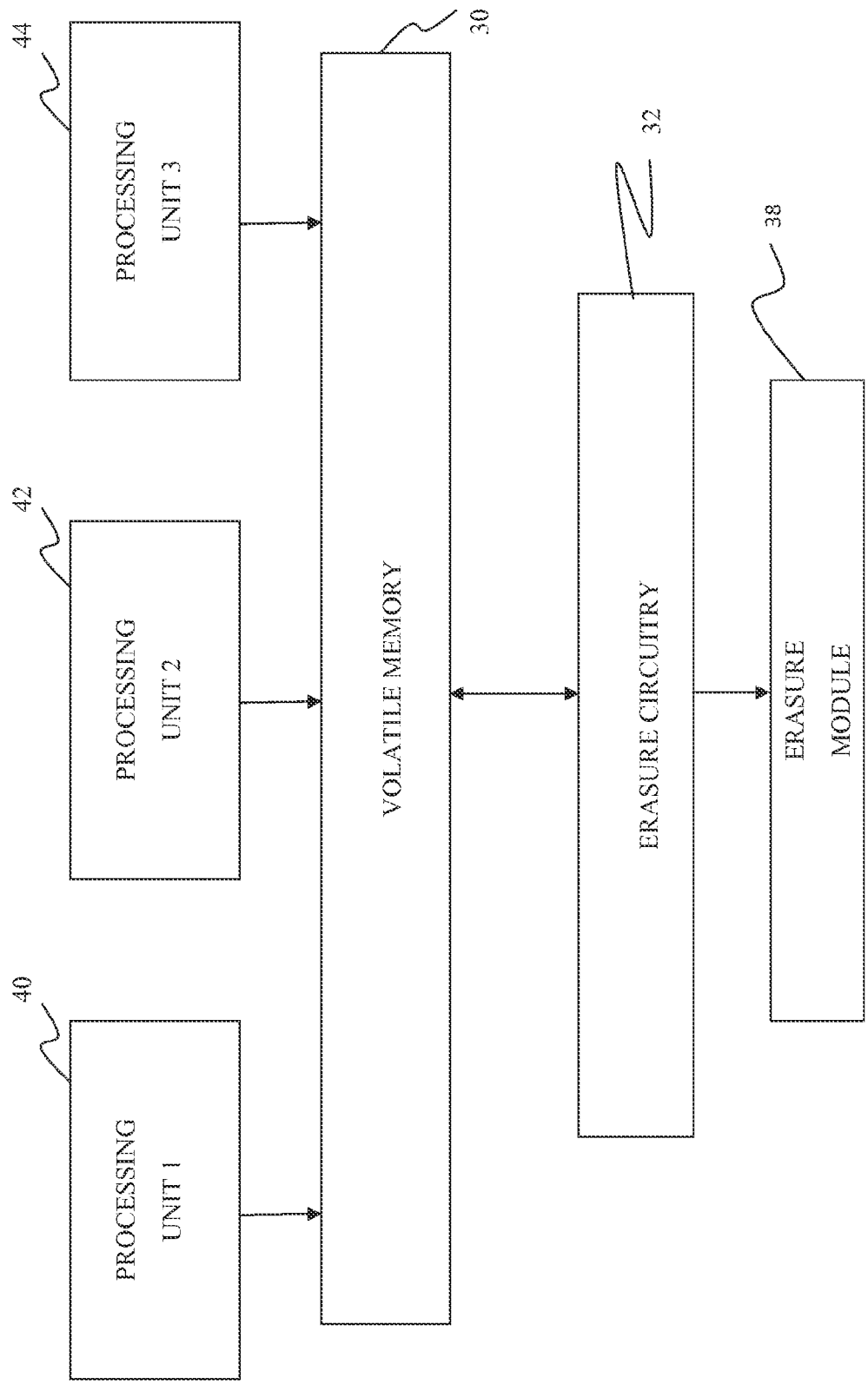
FIG. 8 is a block diagram illustrating multiple processing units connected to a volatile memory, erasure module and erasure circuitry in accordance with an embodiment of the invention.

As illustrated in FIG. 8, the volatile memory 30 can be connected to multiple processing units (40, 42, and 44) for dynamically allocating the volatile memory 30 to the multiple processing units (40, 42, and 44). In this case, the predefined event is before reallocation of the memory 30 from a first processing unit to a second processing unit such that any data stored inside the memory using the first processing unit is erased by the effect of randomizing of data by the control unit 34 before the second processing unit is being reallocated the memory 30. The predefined event is preconfigured using computer readable instructions inside the erasure module 34. The erasure module 38 can run on any one of the processing units (40, 32, and 44) or on a different processing unit depending on the application. The erasure module 38 is connected to the erasure circuitry 32 which in turn is connected to the volatile memory 30. Once the predefined event occurs, erasure module 38 provides instructions to the controller 36 which in turn manages the control unit 34 for initiating the dummy operation on the memory cells for randomizing data of the memory cells.

In an embodiment of the invention, the processing units (40, 42, and 44) are part of one or more virtual machines in a computing cloud.

Figure 9:
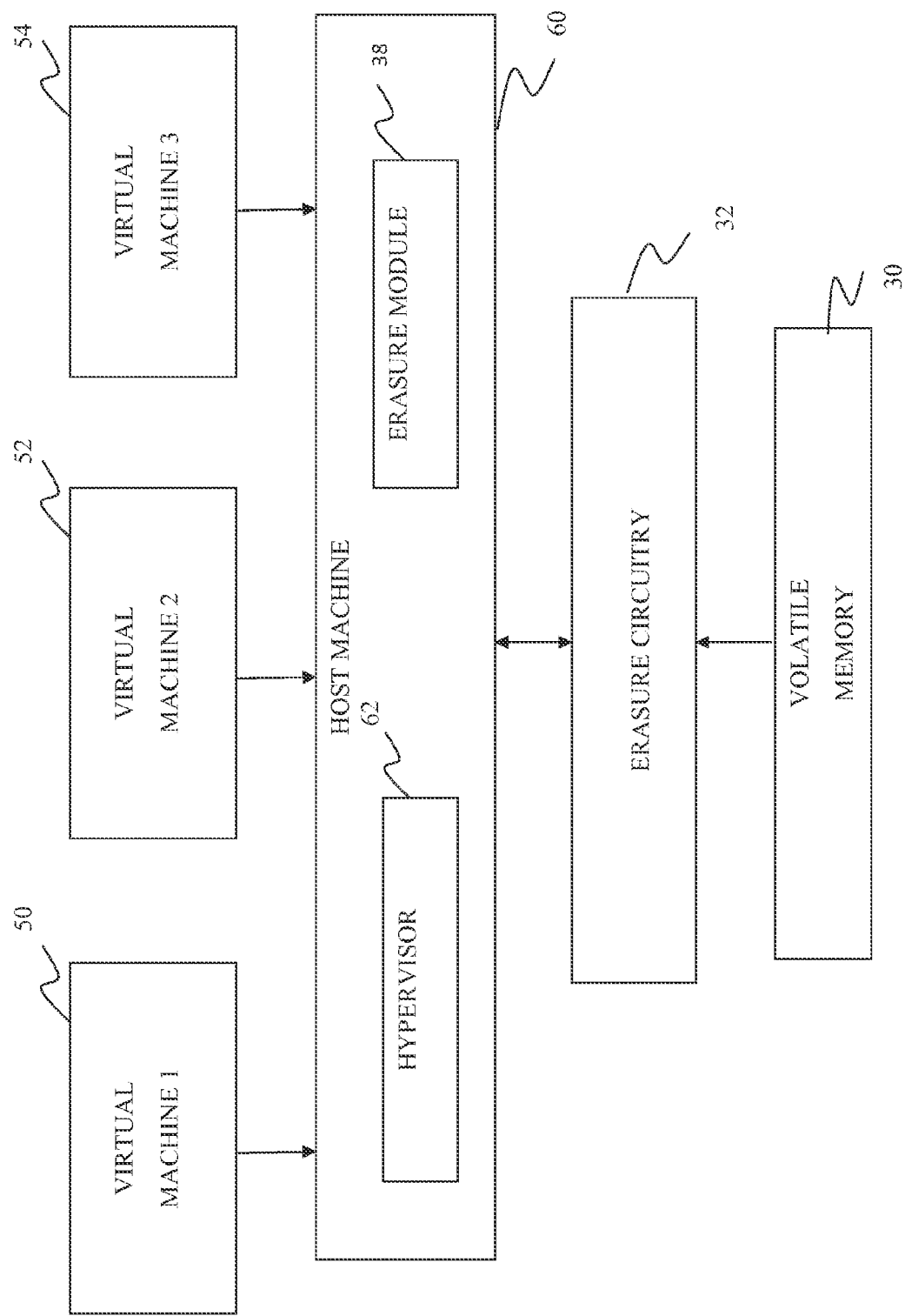
FIG. 9 is a block diagram illustrating multiple virtual machines connected to a host machine, a hypervisor, a erasure module, an erasure circuitry and volatile memory in accordance with an embodiment of the invention.

FIG. 9 illustrates the application of this invention in the context of a computing cloud comprising multiple virtual machines (50, 52, and 54) and a host machine 60 comprising a hypervisor 62. The volatile memory 30 and the erasure circuitry 32 are connected to the host machine (50, 52, and 54) for storing data originating from the use of the virtual machines (50, 52, and 54) by different users. According to this embodiment, the erasure module 38 is adapted to run on the host machine 60 for controlling the method of erasing data from inside the volatile memory 30 at the occurrence of predefined events such as the switching between different users.

In an embodiment of the invention, the volatile memory 30 for erasure is one or more memory banks of a dynamic random access memory (DRAM). The volatile memory 30 can be DRAM or any other type requiring refreshment of data to maintain storage existing now or in the future. When the volatile memory 30 is DRAM, the controller 36 is normally a DRAM controller.

Figure 10:
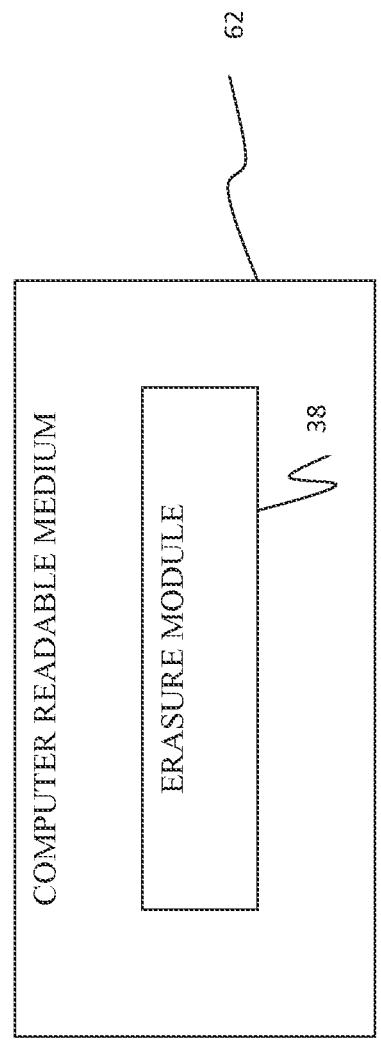
FIG. 10 illustrates a computer readable medium comprising an erasure module in accordance with an embodiment of the invention.
Figure 11A:
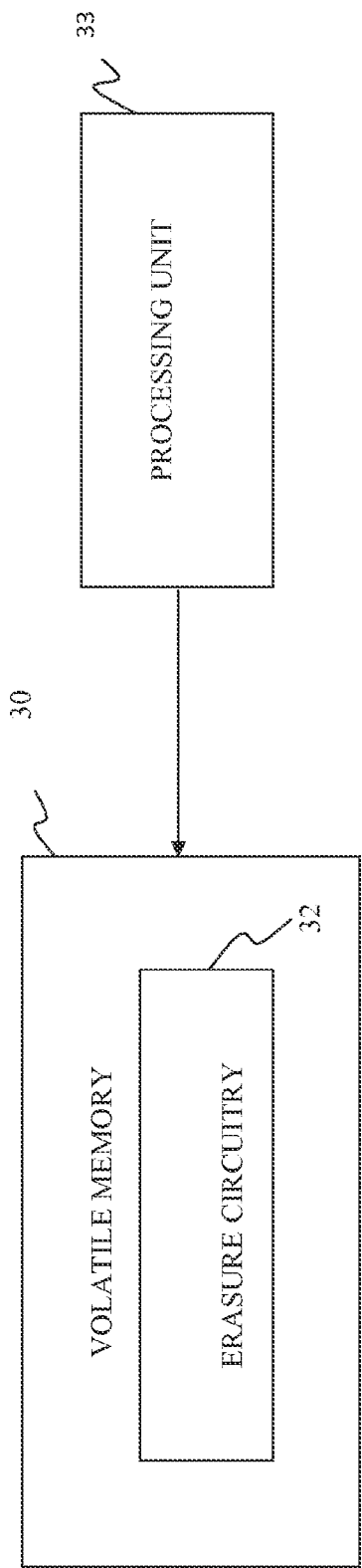
FIG. 11(a) is a block diagram illustrating a volatile memory comprising an erasure circuitry in accordance with an embodiment of the invention.
Figure 11B:
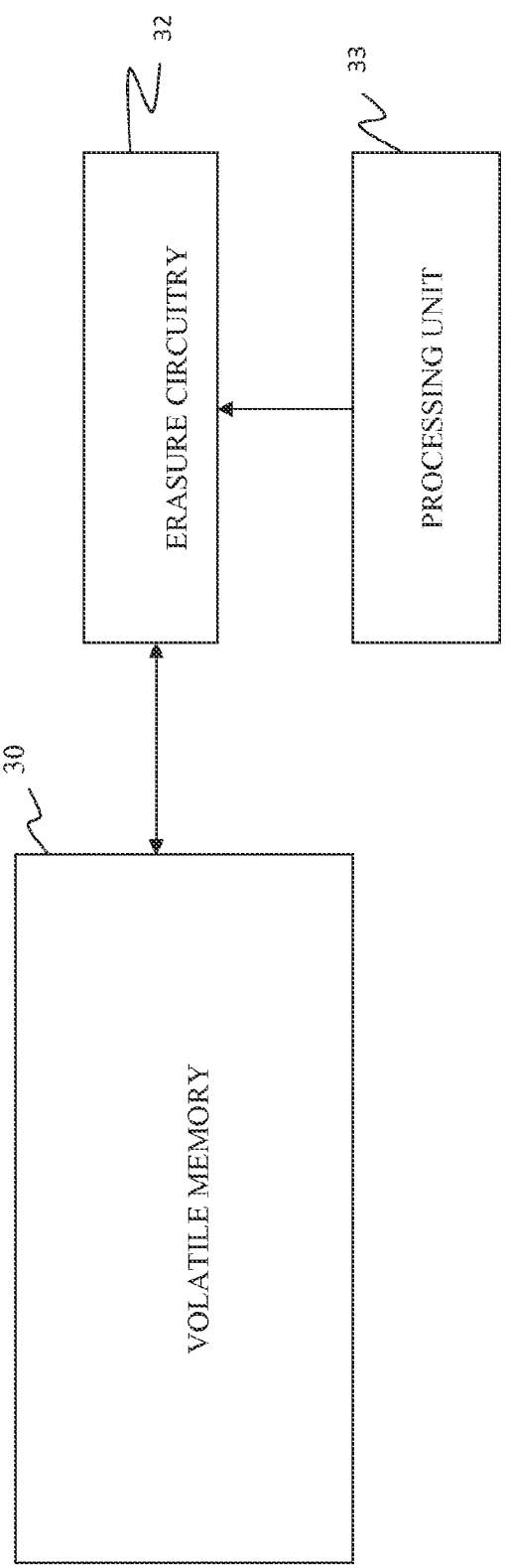
FIG. 11(b) is a block diagram illustrating a volatile memory comprising an erasure circuitry in accordance with another embodiment of the invention.

In an embodiment of the invention, as illustrated in FIG. 10, there is provided a computer readable medium 62 encoded with an erasure module 38 comprising processor executable instructions for execution by a processing unit for controlling the controller 36 of the erasure circuitry 32 connected to a volatile memory 30 such that the controller 36 further manages the control unit 34 for initiating the dummy operation on the memory cells for randomizing of data at the occurrence of a predefined event.

In an embodiment of the invention, the erasure module 38 includes processor executable instructions for controlling the controller 36. When the volatile memory 30 is in a computing cloud, in an embodiment of the invention, the processor executable instructions are adapted to be run by a hypervisor 62 running one or more virtual machines as described above.

As a further aspect of the invention, as illustrated in FIGS. 11(a) and (b), there is provided an erasure circuitry 32 adapted to be connected to a volatile memory 30, for erasing data of one or more memory cells depending on the occurrence of a predefined event.

The erasure circuitry 32 can be part of the volatile module 30 (see FIG. 11(a)) or alternatively in an external circuit (see FIG. 11(b)).

As another aspect of the invention, there is provided a volatile memory 30 comprising an erasure circuitry 32 adapted to initiate a dummy operation to the memory cells for randomizing data at the occurrence of a predefined event. The erasure circuitry 32 is adapted to be connected to an erasure module 38 comprising computer instructions for controlling the erasure circuitry 32 at the occurrence of the predefined event. In an embodiment of the invention, the volatile memory 30 is a DRAM.

In an embodiment of the present invention, the control unit 34 may receive the addresses of the memory blocks to be erased from the processing unit 33 via the operating system 37.

Figure 12:
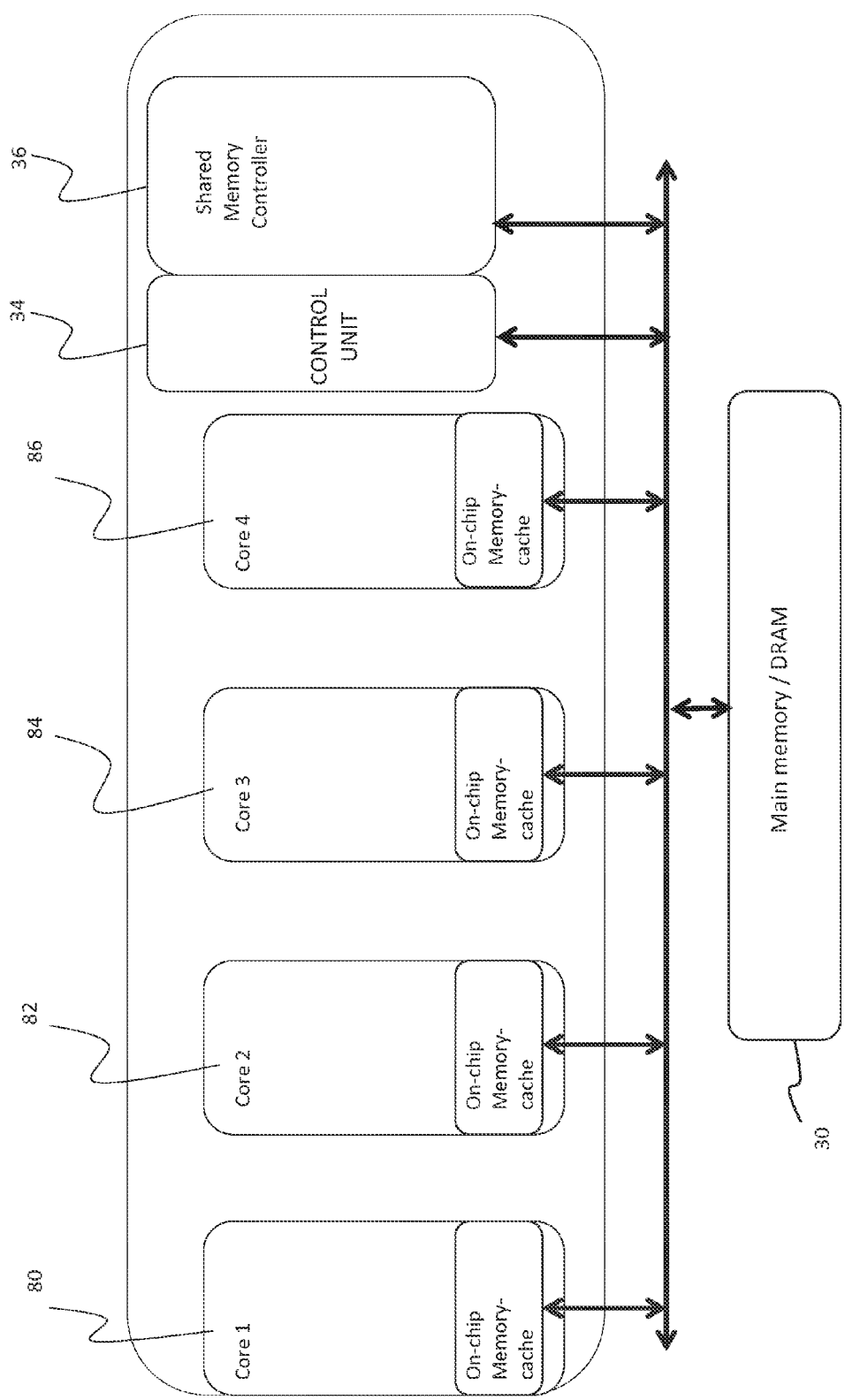
FIG. 12 is a block diagram illustrating a Control Unit operation according to an embodiment of the invention.

FIG. 12 illustrates a block diagram regarding the operation of the control unit 34 with respect to the volatile memory 30 and the controller 36. It is known in the prior art that the controller may be a separate chip from the main memory or it can be integrated with the main memory. The controller 36 controls the initiation of the control unit 34 regarding the initiation of the dummy operation for randomizing of data in the memory cells of the volatile memory at the occurrence of a predefined event.

The foregoing descriptions of specific embodiments of the present invention have been presented for purposes of illustration and description. They are not intended to be exhaustive or to limit the present invention to the precise forms disclosed, and obviously many modifications and variations are possible in light of the above teaching. The embodiments were chosen and described in order to best explain the principles of the present invention and its practical application, and to thereby enable others skilled in the art to best utilize the present invention and various embodiments with various modifications as are suited to the particular use contemplated. It is understood that various omissions and substitutions of equivalents are contemplated as circumstances may suggest or render expedient, but such omissions and substitutions are intended to cover the application or implementation without departing from the spirit or scope of the present invention.

The invention claimed is:

1. An erasure circuitry for erasing a volatile memory comprising a plurality of memory cells, the erasure circuitry adapted to initiate a dummy operation on one or more memory cells to randomize the data stored in the one or more memory cells at the occurrence of a predefined event,
    wherein the control circuit comprises one or more transistor pairs, each transistor pair comprising one nMOS transistor and one pMOS transistor, the one or more transistor pairs being connected there between and further connected to one or more memory cells among the plurality of memory cells such that the pMOS transistor is adapted to impose a 1 logic on the one or more memory cells when the nMOS transistor turns 1 logic, the nMOS transistor being adapted to turn 1 logic at the occurrence of the predefined event and to remain 0 logic otherwise.

2. The erasure circuitry as claimed in claim 1 comprising a control unit, wherein the control unit is being adapted to receive addresses of the one or more memory cells from a processing unit via an operating system, at the occurrence of a predefined event.

3. The erasure circuitry as claimed in claim 2, wherein the processing unit is part of a virtual machine in a cloud computing platform.

4. The erasure circuitry as claimed in claim 2, wherein the processing unit is part of an electronic device or a server.

5. The erasure circuitry as claimed in claim 2, wherein the control unit is embodied in a DRAM controller.

6. The erasure circuitry as claimed in claim 1, wherein the volatile memory is connected to the processing unit accessible by multiple users, processes, applications or services and wherein the predefined event is before switching between a first user, process, application or service and a subsequent user, process, application or service such that any data stored inside the memory by the first user is erased by the randomizing of data in the one or more memory cells by the control unit of the erasure circuitry.

7. The erasure circuitry as claimed in claim 1, wherein the volatile memory is dynamically allocated to multiple processing units and wherein the predefined event is before reallocation of the memory from a first processing unit to a second processing unit such that any data stored inside the memory using the first processing unit is erased by the randomizing of data in the one or more memory cells by the control unit of the erasure circuitry.

8. The erasure circuitry as claimed in claim 7, wherein the processing units are part of one or more virtual machines in a computing cloud.

9. The erasure circuitry as claimed in claim 1, wherein the volatile memory for erasure is one or more memory banks of a dynamic random access memory (DRAM).

10. A method of erasing a volatile memory comprising a plurality of memory cells, the method comprising initiating a dummy operation for randomizing of data stored in one or more memory cells at occurrence of a predefined event, wherein the control circuit comprises one or more transistor pairs, each transistor pair comprising one nMOS transistor and one pMOS transistor, the one or more transistor pairs being connected there between and further connected to one or more memory cells among the plurality of memory cells such that the pMOS transistor is adapted to impose a 1 logic on the one or more memory cells when the nMOS transistor turns 1 logic, the nMOS transistor being adapted to turn 1 logic at the occurrence of the predefined event and to remain 0 logic otherwise.

11. The method as claimed in claim 10, wherein the dummy operation is being initiated by a control unit after receiving address of one or more memory cells from a processing unit via an operating system at the occurrence of a predefined event.

12. The method as claimed in claim 11, wherein the volatile memory is connected to the processing unit accessible by multiple users, processes, applications or services and wherein the predefined event is before switching between a first user, process, application or service and a subsequent user, process, application or service such that any data stored inside the memory by the first user is erased by the randomizing of data in the one or more memory cells by the control unit of the erasure circuitry.

13. The method as claimed in claim 11, wherein the processing unit is part of a virtual machine in a cloud computing platform.

14. The method as claimed in claim 11, wherein the processing unit is part of an electronic device or a server.

15. The method as claimed in claim 10, wherein the volatile memory is dynamically allocated to multiple processing units and wherein the predefined event is before reallocation of the memory from a first processing unit to a second processing unit such that any data stored inside the memory is erased by the randomizing of data in the one or more memory cells by the control unit of the erasure circuitry.

16. The method as claimed in claim 15, wherein the processing units are part of one or more virtual machines in a computing cloud.

17. The method as claimed in claim 10, wherein the volatile memory for erasure is one or more memory banks of a dynamic random access memory (DRAM).

18. The method as claimed in claim 10, further comprising a controller associated with the control unit for randomizing of data in one or more of the memory cells.

19. The method as claimed in claim 18, wherein the controller is a DRAM controller.

20. A volatile memory comprising a control unit adapted to erase the volatile memory by randomizing data of one or more of a plurality of volatile memory cells at occurrence of a predefined event,
    wherein the control circuit comprises one or more transistor pairs, each transistor pair comprising one nMOS transistor and one pMOS transistor, the one or more transistor pairs being connected there between and further connected to one or more memory cells among the plurality of memory cells such that the pMOS transistor is adapted to impose a 1 logic on the one or more memory cells when the nMOS transistor turns 1 logic, the nMOS transistor being adapted to turn 1 logic at the occurrence of the predefined event and to remain 0 logic otherwise.

21. The volatile memory as claimed in claim 20, wherein the control unit is adapted to receive addresses of the one or more memory cells from a processing unit via an operating system, at the occurrence of a predefined event.

22. The volatile memory as claimed in 21, wherein the volatile memory is connected to the processing unit accessible by multiple users, processes, applications or services and wherein the predefined event is before switching between a first user, process, application or service and a subsequent user, process, application or service such that any data stored inside the memory is erased by the randomizing of data in the one or more memory cells by the control unit of the erasure circuitry.

23. The volatile memory as claimed in claim 21, wherein the processing unit is part of a virtual machine in a cloud computing platform.

24. The volatile memory as claimed in claim 21, wherein the processing unit is part of an electronic device or a server.

25. The volatile memory as claimed in claim 20, wherein the volatile memory is a dynamic random access memory (DRAM).

26. The volatile memory as claimed in claim 20, wherein the volatile memory is dynamically allocated to multiple processing units and wherein the predefined event is before reallocation of the memory from a first processing unit to a second processing unit such that any data stored inside the memory using the first processing unit is erased by the randomizing of data in the one or more memory cells by the control unit of the erasure circuitry.

27. The volatile memory as claimed in claim 26, wherein the processing units are part of one or more virtual machines in a computing cloud.

28. The volatile memory as claimed in claim 20, wherein the volatile memory for erasure is one or more memory banks of a dynamic random access memory (DRAM).

29. The volatile memory as claimed in claim 20 further comprising a controller associated with the control unit.

30. The volatile memory as claimed in claim 29, wherein the controller is a DRAM controller.

* * * * *